United States Patent
Park et al.

(10) Patent No.: US 6,958,947 B2
(45) Date of Patent: Oct. 25, 2005

(54) SEMICONDUCTOR MEMORY DEVICE WITH INTERNAL VOLTAGE GENERATORS FOR TESTING A MEMORY ARRAY AND PERIPHERAL CIRCUITS

(75) Inventors: Chul-Sung Park, Seoul (KR);
Hyang-Ja Yang, Kyuggi-do (KR);
Seung-Min Lee, Suwon-shi (KR);
Yong-Hwan Noh, Suwon-shi (KR)

(73) Assignee: Samsung Electronics Co., LTD, Kyunggi-do (KR)

( * ) Notice: Subject to any disclaimer, the term of this patent is extended or adjusted under 35 U.S.C. 154(b) by 0 days.

(21) Appl. No.: 10/359,075

(22) Filed: Feb. 6, 2003

(65) Prior Publication Data
US 2004/0022115 A1 Feb. 5, 2004

(30) Foreign Application Priority Data
Jul. 30, 2002 (KR) ................. 10-2002-0044983

(51) Int. Cl.$^7$ ................................ G11C 5/14
(52) U.S. Cl. .............. 365/228; 365/226; 365/201; 365/189.09; 365/156
(58) Field of Search ............... 365/226, 228, 365/201, 189.09, 154, 156

(56) References Cited

U.S. PATENT DOCUMENTS

| | | | |
|---|---|---|---|
| 6,037,813 A | * | 3/2000 | Eto et al. .................. 327/156 |
| 6,359,459 B1 | * | 3/2002 | Yoon et al. ................ 324/765 |
| 6,498,760 B2 | * | 12/2002 | Yamasaki .................. 365/226 |
| 6,661,729 B2 | * | 12/2003 | Yamasaki .................. 365/226 |

FOREIGN PATENT DOCUMENTS

| | | | |
|---|---|---|---|
| JP | 06349298 | 12/1994 | ......... G11C/29/00 |
| JP | 11185498 | 7/1999 | ......... G11C/29/00 |

* cited by examiner

*Primary Examiner*—Andrew Q. Tran
(74) *Attorney, Agent, or Firm*—Harness, Dickey & Pierce, P.L.C.

(57) ABSTRACT

A semiconductor memory device which includes an internal voltage generator circuit for adjusting an external power supply voltage and generating first and second internal power supply voltages. The first internal power supply voltage is supplied to a memory cell array via a first power supply line, and the second internal power supply voltage is supplied to a peripheral circuit via a second power supply line. A control circuit controls the internal voltage generator circuit so that the levels of the first and second internal power supply voltages vary depending on a mode of operation.

20 Claims, 8 Drawing Sheets

SEMICONDUCTOR MEMORY DEVICE WITH INTERNAL VOLTAGE GENERATORS FOR TESTING A MEMORY ARRAY AND PERIPHERAL CIRCUITS

This U.S. nonprovisional patent application claims priority under 35 U.S.C. §119 upon Korean Patent Application No. 2002-44983, filed on Jul. 30, 2002, the contents of which are herein incorporated by reference in their entirety.

FIELD OF THE INVENTION

The present invention is related to a semiconductor integrated circuit device, and in particular, to a semiconductor memory device which is capable of testing the reliability of memory cells.

BACKGROUND OF THE INVENTION

A static random access memory (SRAM) device includes more metal oxide semiconductor field effect transistors than a conventional dynamic random access memory (DRAM) device, and can store data without refreshing. However, the cross-coupled nature of SRAM cells may result in manufacturing defects in such memory cells. Such defects may not be detectable when a device is produced, but may manifest themselves after time. Such memory cells are referred to as memory cells having a potential defect property.

Memory cells having a potential defect property can be detected by adjusting a static noise margin. The static noise margin is the margin within which a memory cell sustains its own data when reading data. Memory cells having a potential defect property have a smaller static noise margin than that of normal property memory cells. In other words, the larger static noise margin a memory cells has, the lower the probability that stored data will vary during a read operation.

It is possible to identify memory cells with a potential defect property by lowering the static noise margin of those memory cells. For example, lowering of the static noise margin may be accomplished by lowering an operating voltage applied to memory cells below an operating voltage applied to peripheral circuits (e.g., a row decoder, a column decoder, a bit line precharge and equalize circuit, etc.,). Under such operating conditions, it is possible to quickly identify memory cells with the potential defect property. In accordance with this technique, defective memory cells may be replaced or a chip including such defective memory cells may be discarded.

The above-described technique is disclosed in Japanese Patent Laid-open Nos. 11-185498 and 06-349298, which describe methods where an operating voltage applied to memory cells is lowered while an operating voltage applied to peripheral circuits is maintained.

As is well known to those skilled in the art, a packaged memory device is subject to a burn-in test as an accelerated life test. The burn-in test enables potential defects to be detected and removed in advance by operating memory devices under conditions of increased temperature and operating voltage. During a burn-in test of a packaged device, excessive current is consumed, especially by peripheral devices. In a case where an operating voltage is lowered during the burn-in test, the burn-in test cannot be carried out normally or the burn-in effect may be reduced.

SUMMARY OF THE INVENTION

In an exemplary embodiment, the present invention provide a semiconductor memory device capable of improving a burn-in test effect.

In accordance with an exemplary embodiment, the present invention is directed to a semiconductor memory device including an array of memory cells, arranged in a matrix of rows and columns and a data read/write circuit writes/reads out data to/from the array. An internal voltage generator circuit adjusts an external power supply voltage and generates a first internal power supply voltage and a second internal power supply voltage. A first power supply line transfers the first internal power supply voltage to the array, and a second power supply line transfers the second internal power supply voltage to the data read/write circuit. A control circuit controls the internal voltage generator circuit so that the first and second internal power supply voltages vary according to an operational mode of the semiconductor memory device.

During a burn-in test mode of operation, the control circuit controls the internal voltage generator circuit so that the second internal power supply voltage is less than the first internal power supply voltage. During a test mode of operation for controlling a static noise margin of the memory cells, the control circuit controls the internal voltage generator circuit so that the first internal power supply voltage is less than the second internal power supply voltage. During a normal mode of operation, the control circuit controls the internal voltage generator circuit so that the first internal power supply voltage is the same or substantially the same as the second internal power supply voltage, the first and second internal power supply voltages being constantly or substantially constantly maintained irrespective of variations of the external power supply voltage.

In accordance with another exemplary embodiment, the present invention is directed to a semiconductor memory device which comprises an array of memory cells which are arranged in a matrix of rows and columns, a data read/write circuit which writes/reads out data to/from the array, a reference voltage generator circuit which generates a reference voltage of a constant level, a first variable reference voltage generator circuit which is supplied with the reference voltage and an external power supply voltage and generates a first variable reference voltage in response to a first control code, a second variable reference voltage generator circuit which is supplied with the reference voltage and the external power supply voltage and generates a second variable reference voltage in response to a second control code, a first internal voltage generator circuit which is supplied with the external power supply voltage and generates a first internal power supply voltage in response to the first variable reference voltage, a first power supply line which transfers the first internal power supply voltage to the array, a second internal voltage generator circuit which is supplied with the external power supply voltage and generates a second internal power supply voltage in response to the second variable reference voltage, a second power supply line which transfers the second internal power supply voltage to the data read/write circuit, and a control circuit which generates the first control code and the second control code in response to test information. During a package/wafer burn-in test mode of operation, the control circuit generates the first and second control codes so that the first internal power supply voltage is larger than the second internal power supply voltage.

In accordance with another exemplary embodiment, the present invention is directed to semiconductor memory device comprising a first voltage generator for supplying a first internal power supply voltage to a memory cell array, a second voltage generator for supplying a second internal power supply voltage to one or more peripheral circuits, and a control circuit for controlling the first and second voltage generators so that the first and second internal power supply voltages vary according to an operational mode of the semiconductor memory device.

In accordance with another exemplary embodiment, the control circuit controls the first and second voltage generators so that the first and second internal power supply voltages are substantially different in a test mode.

In accordance with another exemplary embodiment, the control circuit controls the first and second voltage generators so that the first internal power supply voltage is greater than the second internal power supply voltage when the semiconductor memory device in a burn-in test mode.

In accordance with another exemplary embodiment, the control circuit controls the first and second voltage generators so that the second internal power supply voltage is greater than the first internal power supply voltage when the semiconductor memory device is in a potential defect property detect mode.

BRIEF DESCRIPTION OF THE DRAWINGS

A more complete appreciation of the present invention, and many of the attendant advantages thereof, will become readily apparent as the same becomes better understood by reference to the following detailed description and drawings of exemplary embodiments of the present invention, in which like reference symbols indicate the same or similar components, wherein.

DESCRIPTION OF EXEMPLARY EMBODIMENTS

Exemplary embodiments of the present invention will be more fully described with reference to the attached drawings.

Figure 1:
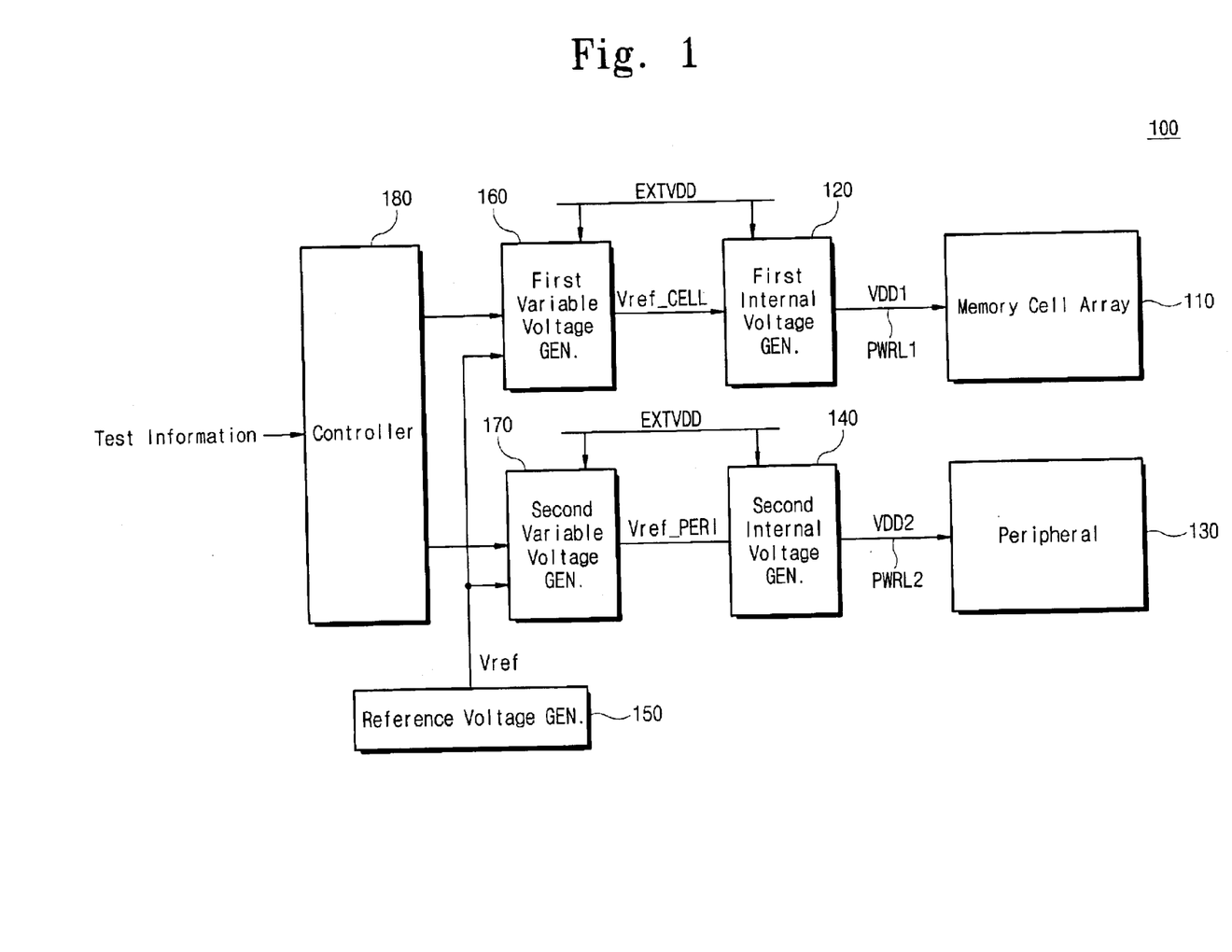
FIG. 1 is a block diagram of a semiconductor memory device according to an exemplary embodiment of the present invention.

FIG. 1 illustrates a semiconductor memory device according to an exemplary embodiment of the present invention. Referring to FIG. 1, a semiconductor memory device 100 according to an exemplary embodiment of the present invention is an SRAM device, but it is obvious that the spirit of the invention can be applied to other types of memory devices, for example, DRAM, FRAM, EEPROM, etc. The semiconductor memory device 100 includes a memory cell array 110 for storing data information, and is supplied with a first internal power supply voltage VDD1 from a first internal voltage generator circuit 120 via a power supply line PWRL1. A peripheral circuit 130 is supplied with a second internal power supply voltage VDD2 from a second internal voltage generator circuit 140 via a power supply line PWRL2. The peripheral circuit 130 controls read and write operations of the memory cell array 110, which will be more fully described hereinafter.

Still referring to FIG. 1, the semiconductor memory device 100 further includes a reference voltage generator circuit 150, a first variable voltage generator circuit 160, a second variable voltage generator circuit 170, and a controller circuit 180. The reference voltage generator circuit 150 generates a reference voltage Vref of a constant level within a normal operation range. Such a reference voltage generator circuit 150 can be easily designed by those skilled in the art, therefore, an exemplary circuit of the reference voltage generator circuit 150 will not be described further.

The first variable voltage generator circuit 160 is supplied with the reference voltage Vref and an external power supply voltage EXTVDD, and generates a variable reference voltage Vref_CELL according to a mode of operation under the control of the control circuit 180. The reference voltage Vref_CELL is supplied to the first internal voltage generator circuit 120.

The second variable voltage generator circuit 170 is supplied with the reference voltage Vref and the external power supply voltage EXTVDD, and generates a variable reference voltage Vref_PERI according to a mode of operation under the control of the control circuit 180. The reference voltage Vref_PERI is supplied to the second internal voltage generator circuit 140.

In accordance with an exemplary embodiment of the present invention, the control circuit 180 controls the first and second variable voltage generator circuits 160 and 170 in response to externally applied test information so that the internal power supply voltages VDD1 and VDD2 vary according to a mode of operation. For example, during a burn-in test mode of operation, the control circuit 180 controls the first and second variable voltage generator circuits 160 and 170 so that the internal power supply voltage VDD2 is lower than the internal power supply voltage VDD1. This reduces current consumption by the peripheral circuit 130 during the burn-in test operation and does not reduce or cancel the burn-in effect.

In an exemplary embodiment, test information may be applied to the control circuit 180 using a JTAG code, unused pins (e.g., dedicated user pins), or command combination. As a result, the semiconductor memory device 100 can control the first and second variable voltage generator circuits 160 and 170 at a wafer level as well as at a package level using the control circuit 180.

Figure 2:
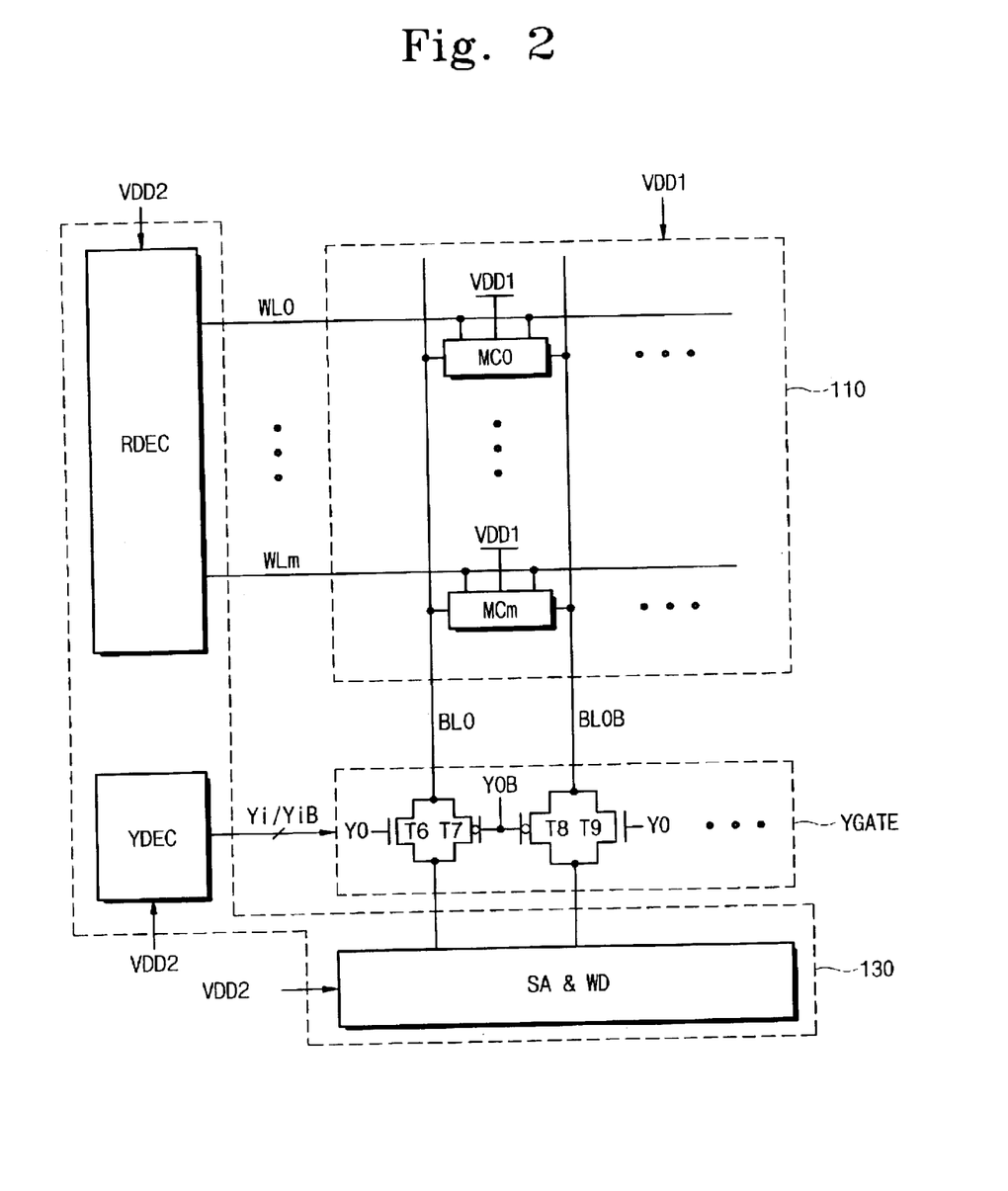
FIG. 2 is a block diagram of an exemplary memory cell array and an exemplary peripheral circuit illustrated in FIG. 1.
Figure 3:
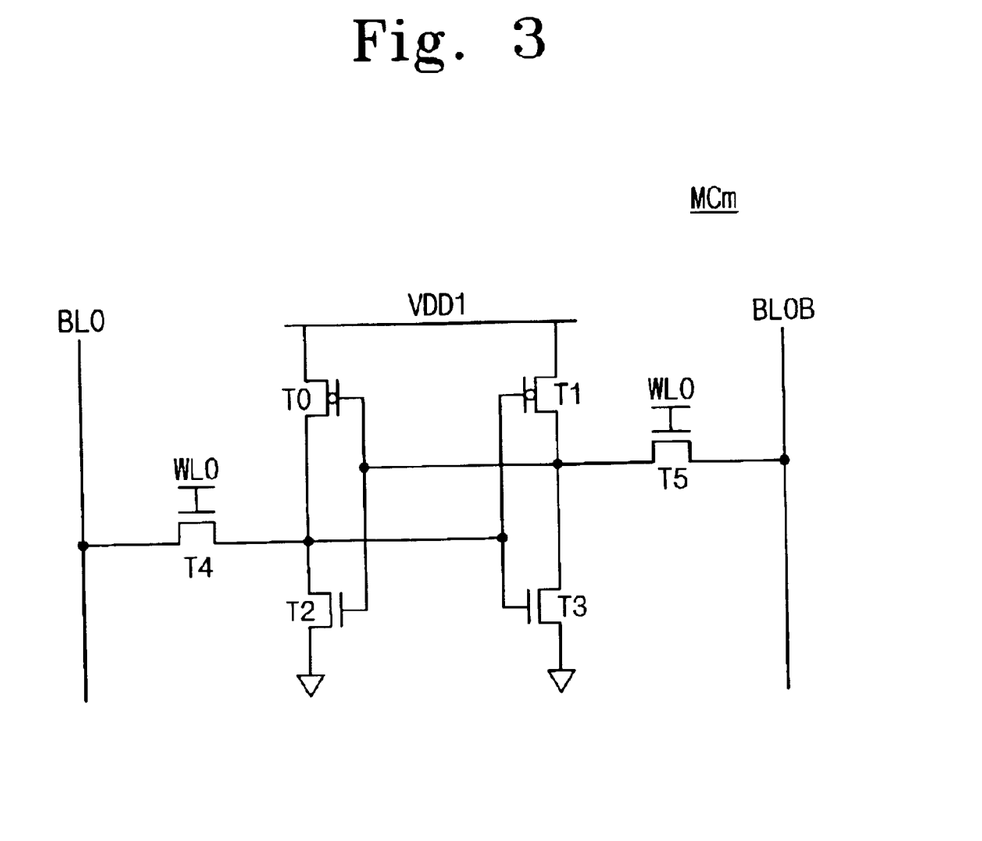
FIG. 3 is a circuit diagram of the exemplary memory cell illustrated in FIG. 2.

FIG. 2 illustrates the memory cell array 110 and the peripheral circuit 130 of FIG. 1 in more detail, and FIG. 3 illustrates a memory cell of FIG. 2 in more detail.

As illustrated in FIG. 2, the memory cell array 110 includes memory cells MC0-MCm which are arranged in a matrix of rows (or word lines) and columns (or bit lines). Each of the memory cells MC0-MCm is an SRAM cell, which is configured as illustrated in FIG. 3. As shown in FIGS. 2 and 3, the internal power supply voltage VDD1 from the first internal voltage generator circuit 120 is supplied to the memory cells MC0-MCm. A row decoder circuit RDEC forming a row selector circuit, column decoder and column pass gate circuits YDEC and YGATE forming a column selector circuit, and a sense amplifier and write driver circuit SA&WD are included in the peripheral circuit 130 of FIG. 2. The above circuits, forming the peripheral circuit 130, are well known to those skilled in the art, and will not be described further.

The internal power supply voltage VDD2 from the second internal voltage generator circuit 140 is supplied to the row decoder circuit RDEC, the column decoder circuit YDEC, the column pass gate circuit YGATE, and the sense amplifier and write driver circuit SA&WD, namely, the memory cell array 110 power system is separated from the peripheral circuit 130 power system. When VDD2 is supplied to YDEC, the YDEC activates a column select signal (e.g., Y0) based on column address information. At this time, the activated column select signal Y0 has the voltage of VDD2.

Figure 4:
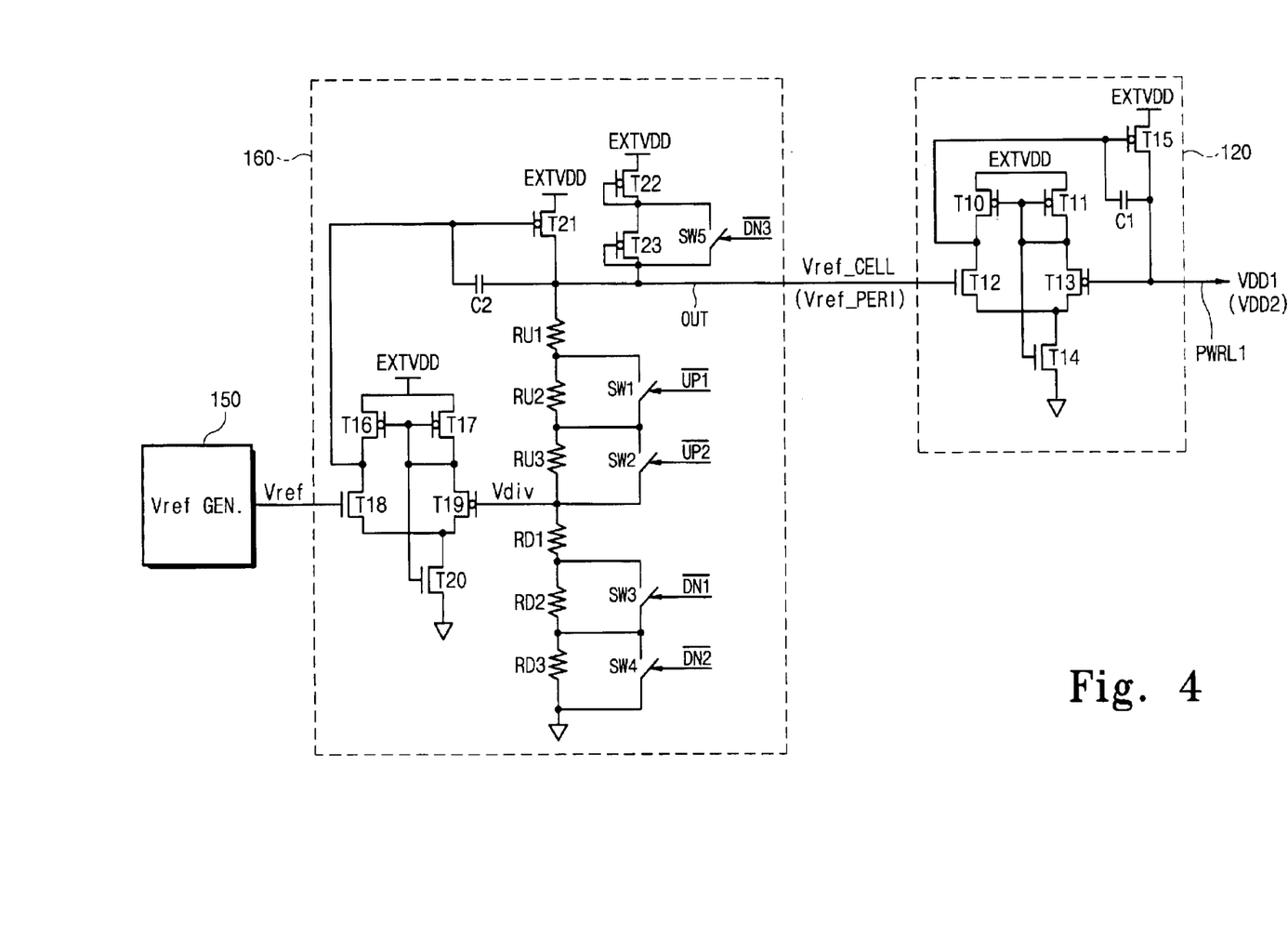
FIG. 4 is a circuit diagram of exemplary first and second variable voltage generator circuits illustrated in FIG. 1.

FIG. 4 illustrates the first internal voltage generator circuit and the first variable voltage generating circuit according to an exemplary embodiment of the present invention. Referring to FIG. 4, the first internal voltage generator circuit 120 is supplied with the variable reference voltage Vref_CELL and the external power supply voltage EXTVDD, and generates an internal power supply voltage VDD1 to be supplied to the memory cell array 110. The first internal voltage generator circuit 120 includes three PMOS transistors T10, T11, and T15, three NMOS transistors T12, T13, and T14, and a capacitor C1, which may be connected as illustrated in FIG. 4. The PMOS and NMOS transistors T10–T14 constitute a differential amplifier that acts as a comparator. The PMOS transistor T15 forms a driver that operates responsive to an output of the comparator. The comparator (T10–T14) compares the internal power supply voltage VDD1 on the power supply line PWRL1 with the reference voltage Vref_CELL, and the driver (T15) adjusts the amount of current supplied to the power supply line PWRL1 in response to a comparison result.

Still referring to FIG. 4, the first variable voltage generator circuit 160 may include five PMOS transistors T16, T17, T21, T22, and T23, three NMOS transistors T18, T19, and T20, six resistors RU1, RU2, RU3, RD1, RD2, and RD3, five switches SW1–SW5, and a capacitor C2, which are connected as illustrated. The resistors RU1–RU3 and RD1–RD3 and the switches SW1–SW4 form a voltage divider that divides the voltage Vref_CELL on an output node OUT in response to control signals /UP1, /UP2, /DN1, and /DN2. The PMOS and NMOS transistors T16–T20 form a comparator that compares a divided voltage Vdiv with a reference voltage Vref, and the PMOS transistor T21 forms a driver that operates responsive to an output of the comparator (T16–T20). The PMOS transistors T22 and T23 and the switch SW5 form a pull-up circuit that pulls up a voltage on the output node OUT in response to a control signal /DN3.

The first internal voltage generator circuit 120 and the first variable voltage generator circuit 160 are shown in FIG. 4. However, the second internal voltage generator circuit 140 and the second variable voltage generator circuit 170 may also be configured substantially the same as those in FIG. 4, except that on-off states of the switches SW1–SW5 in FIG. 4 are established differently. That is, logic states of the control signals /UP1, /UP2, /DN1, /DN2, and /DN3 applied to the first variable voltage generator circuit 160 will be set differently from or the same as those applied to the second variable voltage generator circuit 170. This means that variable reference voltages Vref_CELL and Vref_PERI each generated from the first and second variable voltage generator circuits 160 and 170 have the same or different values according to the mode of operation.

Figure 5:
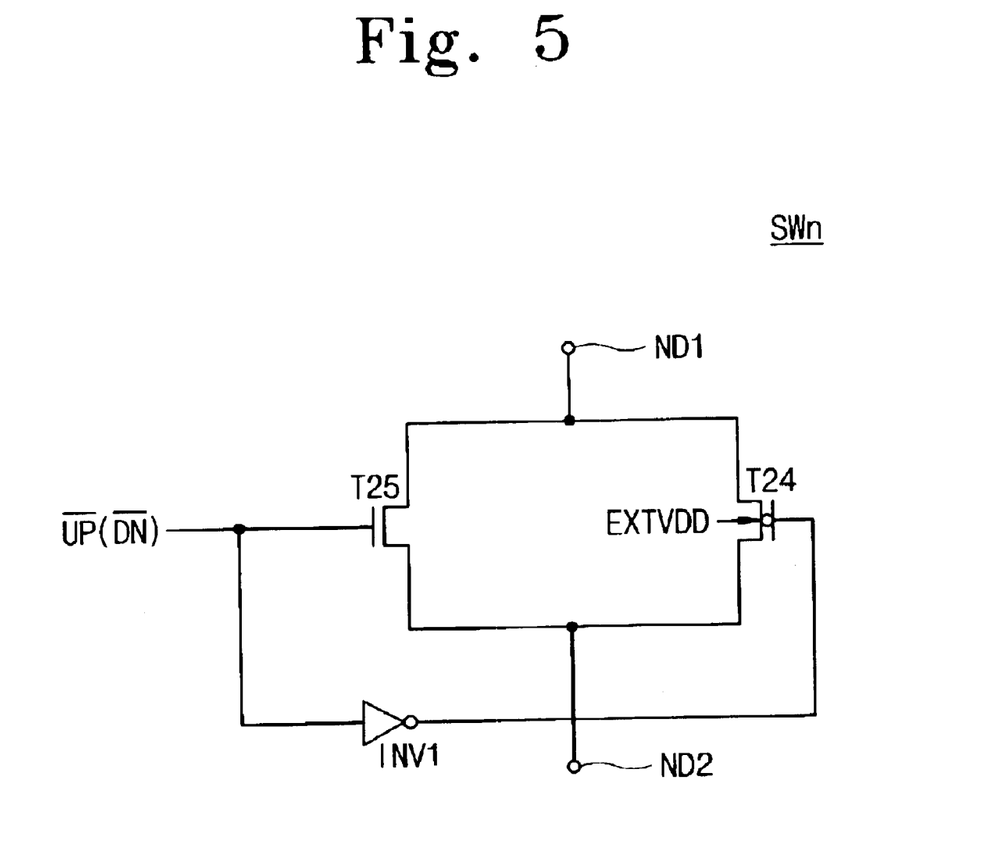
FIG. 5 is a circuit diagram of an exemplary switch illustrated in FIG. 4.

FIG. 5 illustrates one of the switches illustrated in FIG. 4 according to an exemplary embodiment of the present invention. Referring to FIG. 5, a switch SW1 includes a PMOS transistor T24, an NMOS transistor T25, and an inverter INV1, which are connected as illustrated. A bulk region of the PMOS transistor T24 is biased with an external power supply voltage EXTVDD. Both terminals ND1 and ND2 of the switch SW1 are electrically isolated or interconnected according to a logic state of an input signal /UP or /DN.

An exemplary test operation on a semiconductor memory device is described below with reference to FIGS. 6A to 6E. In accordance with an exemplary semiconductor memory device, internal power supply voltages VDD1 and VDD2 have the same (or substantially the same) or different values according to the mode of operation. The semiconductor memory device of exemplary embodiments of the present invention may operate in a normal mode of operation and in a test mode of operation.

In the normal mode of operation, the internal power supply voltage VDD1 applied to a memory cell array 110 is the same or substantially the same as the internal power supply voltage VDD2 applied to a peripheral circuit 130. In the normal mode of operation, an external power supply voltage EXTVDD is between voltages V1 and V2 in FIG. 6A. To make the internal power (supply voltages VDD1 and VDD2 equal, a control circuit 180 generates control codes so that switches SW1–SW4 in the first and second variable voltage generator circuits 160 and 170 are switched on. That is, control signals /UP1, /UP2, /DN1, and /DN2 each having a logic high level are applied to the first and second variable voltage generator circuits 160 and 170. A control signal /DN3 applied to the first and second variable voltage generator circuits 160 and 170 has a logic high level. Under this condition, an output voltage Vref_CELL of the first variable voltage generator circuit 160 is as follows.

$$\text{Vref\_CELL} = \left(1 + \frac{RU}{RD}\right) \times Vref \quad [\text{Equation 1}]$$

where RU indicates a resistance value of RU1, and RD indicates a resistance value of RD1.

Figure 6A:
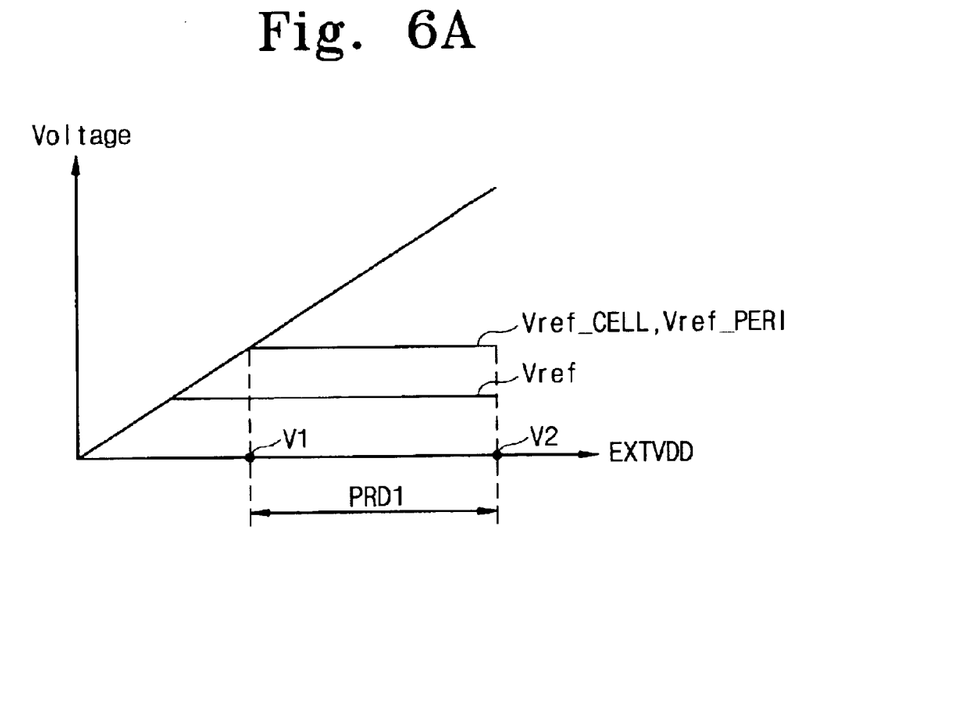
FIG. 6A is a diagram showing variations in reference voltages during a normal mode of operation.

An output voltage Vref_PERI of the second variable voltage generator circuit 170 may be determined in the same manner as that of the first variable voltage generator circuit 160. Accordingly, the variable reference voltages Vref_CELL and Vref_PERI, as illustrated in FIG. 6A, have the same or substantially the same value in the normal mode of operation.

The first internal voltage generator circuit 120 generates the internal power supply voltage VDD1 to be supplied to the memory cell array 110 in response to the reference voltage Vref_CELL from the first variable voltage generator circuit 160. Likewise, the second voltage generator circuit 140 generates an internal power supply voltage VDD2 to be supplied to the peripheral circuit 130 in response to the reference voltage Vref_PERI from the second variable voltage generator circuit 170. Since the reference voltages Vref_CELL and Vref_PERI are equal or substantially equal during the normal mode of operation (in an interval denoted by "PRD1"), the internal power supply voltages VDD1 and VDD2 are also equal or substantially equal.

During the normal mode of operation, since the control signal /DN3 applied to the first and second variable voltage generator circuits 160 and 170 has the logic high level, an output node OUT of the circuits 160 and 170 is connected to the external power supply voltage EXTVDD via a PMOS transistor T22. Assuming that a threshold voltage of the PMOS transistor T21 is sufficiently high, the reference voltage Vref__CELL/PERI may be determined only by the PMOS transistor T21 during the normal mode of operation. Alternatively, additional diode-connected PMOS transistors can be connected between the external power supply voltage EXTVDD and the PMOS transistor T22 so that the reference voltage Vref__CELL/PERI is determined only by the PMOS transistor T21 during the normal mode of operation.

Figure 6B:
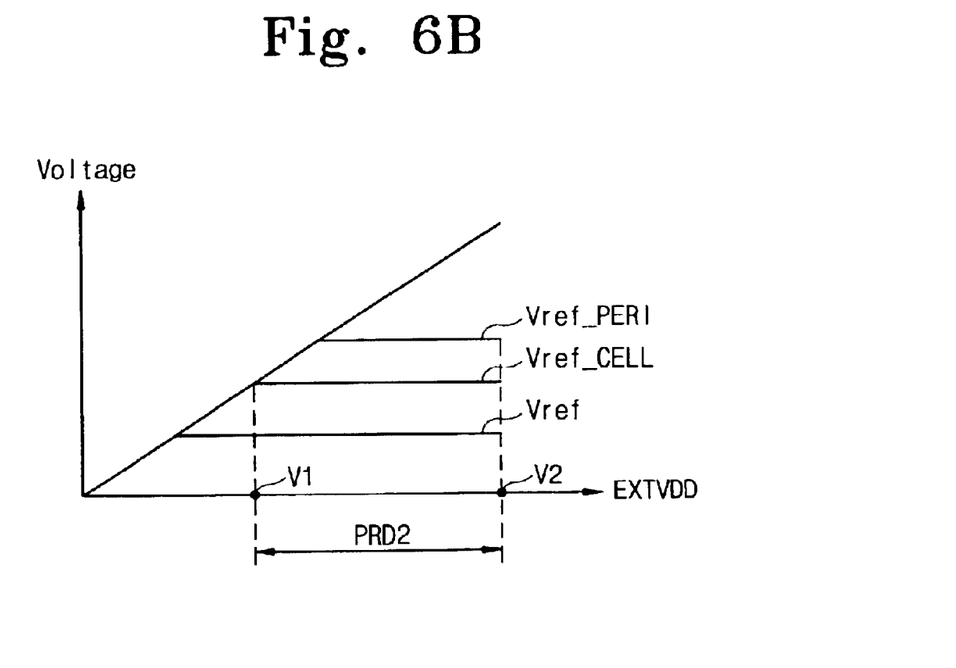
FIGS. 6B–6D are diagrams showing variations in reference voltages during a test mode of operation where a static noise margin is controlled.

In a test mode of operation, where a static noise margin is controlled to search memory cells for a potential defect property, the internal power supply voltage VDD1 applied to the memory cell array 110 is lower than the internal power supply voltage VDD2 applied to the peripheral circuit 130. During the test mode of operation, the external power supply voltage EXTVDD is between the voltages V1 and V2 or in an interval denoted by "PRD2", as illustrated in FIG. 6B.

In order to make the internal power supply voltage VDD1 lower than the internal power supply voltage VDD2, the control circuit 180 generates a control code so that an output voltage Vref__PERI of the second variable voltage generator circuit 170 is increased. That is, the control circuit 180 activates the control signals /UP1 and /UP2 (or either one of the control signals) applied to the second variable voltage generator circuit 170 low. At this time, the control signals /DN1, /DN2, and /DN3 have the logic high level. In an exemplary embodiment, only two control signals /UP1 and /UP2 are used, but more control signals can also be used. The number of control signals may be increased to change the output voltage Vref__PERI. Under this condition, switches SW1 and SW2 of the second variable voltage generator circuit 170 are switched off. At this time, the output voltage Vref__PERI of the second variable voltage generator circuit 170 is as follows.

$$\text{Vref\_PERI} = \left(1 + \frac{RU}{RD1}\right) \times Vref \quad \text{[Equation 2]}$$

where RU indicates a resistance value of RD1+RD2 (when /UP1 is low), RD1+RD(when /UP2 is low), or RD1+RD2+RD3 (when /UP1 and /UP2 are all low).

As compared with the normal mode of operation, the output voltage Vref__PERI of the second variable voltage generator circuit 170 is higher than that Vref__CELL of the first variable voltage generator circuit 160, based on increase in a total resistance value of RU. The output voltage Vref__CELL of the first variable voltage generator circuit 160, as shown in FIG. 6B, is not adjusted, namely, the control circuit 180 controls the first variable voltage generator circuit 160 so that the variable reference voltage Vref__CELL is not changed.

The first internal voltage generator circuit 120 generates the internal power supply voltage VDD1, which is applied to the memory cell array 110, in response to the reference voltage Vref__CELL from the first variable voltage generator circuit 160. Likewise, the second internal voltage generator circuit 140 generates the internal power supply voltage VDD2, which is supplied to the peripheral circuit 130, in response to the reference voltage Vref__PERI from the second variable voltage generator circuit 170. Since the reference voltage Vref__CELL is lower than the reference voltage Vref__PERI during the test mode of operation (in FIG. 6B, an interval denoted by "PRD2"), the internal power supply voltage VDD1 is lower than the internal power supply voltage VDD2. Since the internal power supply voltage VDD1 is lower than the internal power supply voltage VDD2, the static noise margin (SNM) of the memory cells is lowered. As set for above, it is thus possible to search memory cells for the potential defect property more rapidly and easily by performing the read and write operations under the above-described condition.

Figure 6C:
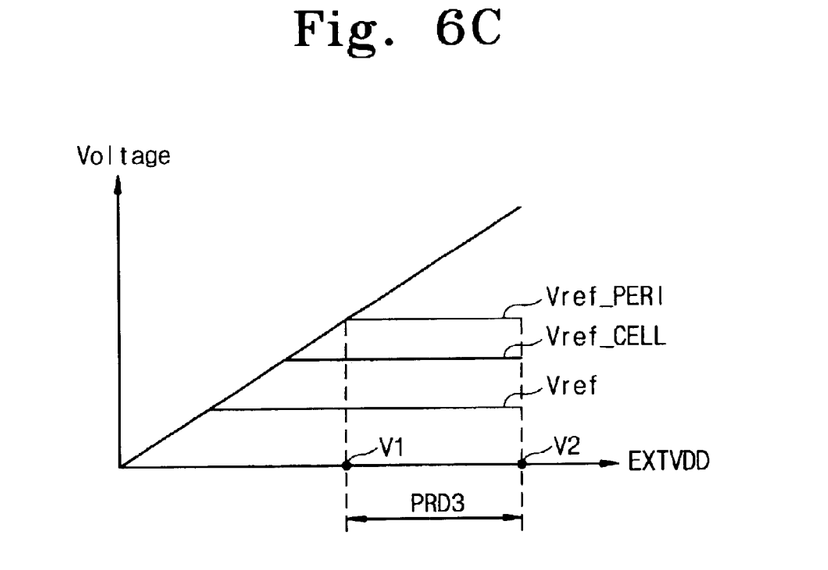
Figure 6D:
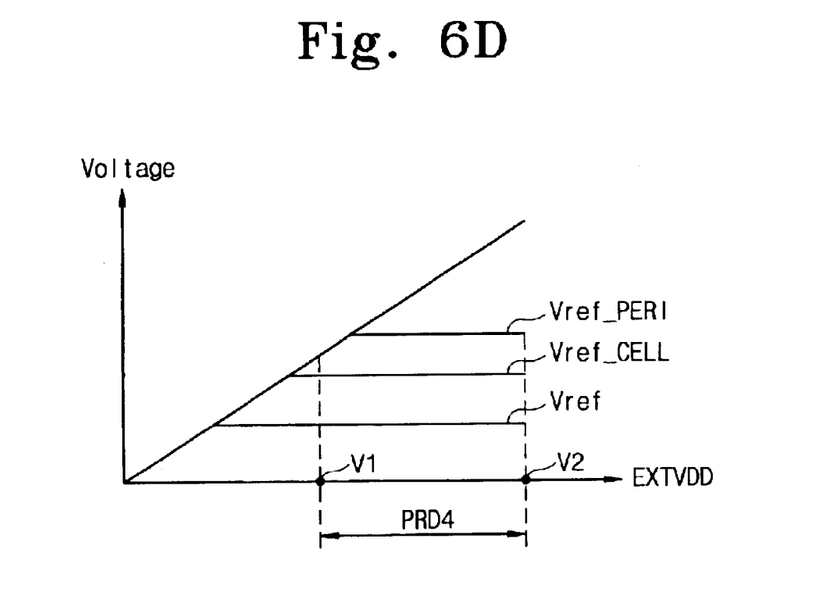

Various methods can be used which make the internal power supply voltage VDD1 applied to the memory cell array 110 lower than the internal power supply voltage VDD2 applied to the peripheral circuit 130 during the test mode of operation, where the static noise margin is controlled. For example, as shown in FIG. 6C, the first and second variable voltage generator circuits 160 and 170 can be controlled such that an output voltage Vref__CELL of the first variable voltage generator circuit 160 is changed and an output voltage Vref__PERI of the second variable voltage generator circuit 170 is not changed. This is accomplished by switching switches SW3 and SW4 of the circuit 160 off and switching switches SW1–SW4 of the second circuit 170 on. Alternatively, as illustrated in FIG. 6D, the circuits 160 and 170 can be controlled such that the voltages Vref__CELL and Vref__PERI are changed with respect to each other. This is accomplished by switching the switches SW3 and SW4 of the circuit 160 off and the switches SW1 and SW2 of the circuit 170 on. It is apparent to one of ordinary skill in the art that the number of switches in the respective circuits 160 and 170 may be changed to change the output voltage Vref__CELL/PERI as desired.

In case of a burn-in test mode of operation, the internal power supply voltage VDD2 to the peripheral circuit 130 is lower than the internal power supply voltage VDD1 to the array 110. The burn-in test mode of operation is represented by an interval denoted by "PRD5" in FIG. 6E. The reference voltages Vref__CELL and Vref__PERI increase along the external power supply voltage EXTVDD in the PRD5 interval.

Figure 6E:
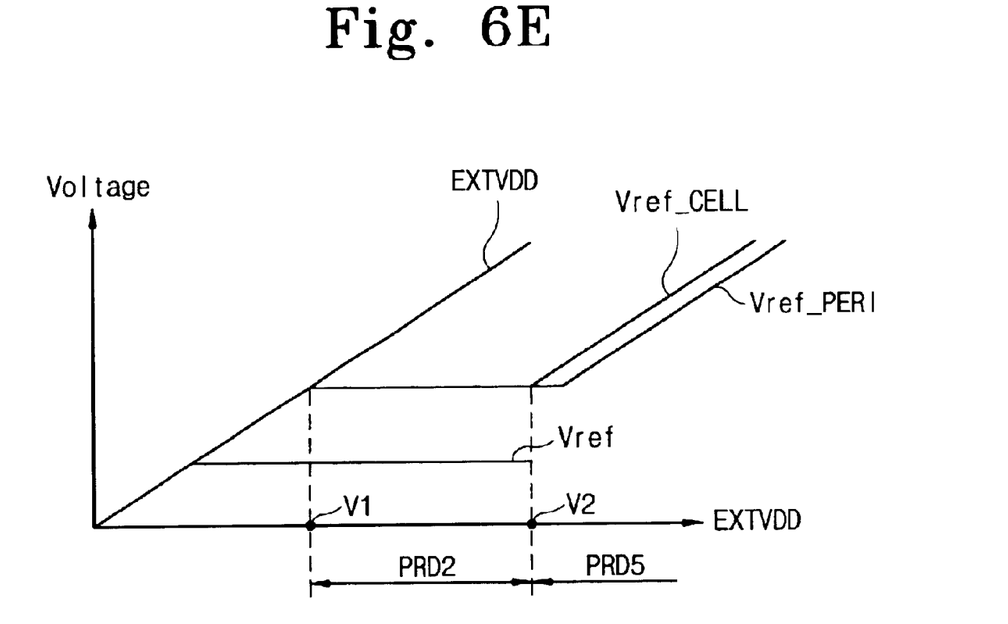
FIG. 6E is a diagram showing variations in reference voltages during a burn-in test mode of operation.

During the burn-in test mode of operation, the control circuit 180 applies the control signal /DN3 having a logic high level to the first variable voltage generator circuit 160. Assuming that the control signals /DN1, /DN2, /UP1, and /UP2 have logic low/high levels, respectively, during the burn-in test mode of operation, the reference voltage Vref__CELL to the first internal voltage generator circuit 120 is not determined by a comparison result of a differential amplifier in the first variable voltage generator circuit 160, but by PMOS transistors T22 and T23. For this reason, the variable reference voltage Vref__CELL increases along the external power supply voltage EXTVDD. Since the control signal /DN3 is high, the reference voltage Vref__CELL becomes a voltage of EXTVDD−Vth (Vth is a threshold voltage of a PMOS transistor).

Further, the control circuit 180 applies the control signal /DN3 having a logic low level to the second variable voltage generator circuit 170. Assuming that the control signals /DN1, /DN2, /UP1, and /UP2 have logic low/high levels, respectively, during the burn-in test mode of operation, the reference voltage Vref__PERI to the second internal voltage generator circuit 140 is not determined by a comparison result of a differential amplifier in the second variable voltage generator circuit 170, but by PMOS transistors T22 and T23. Since the control signal /DN3 is low, the reference voltage Vref__PERI becomes a voltage of EXTVDD−2Vth (Vth is a threshold voltage of a PMOS transistor).

In accordance with the above description, during the burn-in test mode of operation, the reference voltage Vref__CELL is (EXTVDD−Vth) and the reference voltage Vref__PERI is (EXTVDD−2Vth). As illustrated in FIG. 6E, since the reference voltage Vref__PERI is lower than the reference voltage Vref_CELL, the internal power supply voltage VDD2 to the peripheral circuit 130 is lower than that VDD1 to the memory cell array 110. Accordingly, it is possible to reduce current consumed by the peripheral circuit 130 during the burn-in test operation, by making the internal power supply voltage VDD2 lower than the internal power supply voltage VDD1.

As set forth above, the reference voltages Vref_CELL and Vref_PERI each applied to the internal voltage generator circuits 120 and 140 are changed via the control circuit 180. In particular, in case of a packaged semiconductor memory device, it is possible to reduce current consumed by the peripheral circuit 130 during the burn-in test operation, by making the internal power supply voltage VDD2 lower than the internal power supply voltage VDD1 by use of the control circuit 180. Thus, by reducing the drop of an internal power supply voltage used during the burn-in test operation, a burn-in test operation can be carried out normally at the wafer level and the effect thereof can be improved.

The present invention has been described using exemplary embodiments. However, it is to be understood that the scope of the invention is not limited to the disclosed exemplary embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor memory device comprising:
an array memory cells which are arranged in a matrix of rows and columns;
a data read/write circuit which writes/reads data to/from the array;
an internal voltage generator circuit which adjusts an external power supply voltage and generates a first internal power supply voltage and a second internal power supply voltage;
a first power supply line which transfers the first internal power supply voltage to the array;
a second power supply line which transfers the second internal power supply voltage to the data read/write circuit; and
a control circuit which controls the internal voltage generator circuit so that the first and second internal power supply voltages vary according to an operational mode of the semiconductor memory device;
wherein at a test mode of operation for controlling a static noise margin of the memory cells, the control circuit controls the internal voltage generator circuit so that the first internal power supply voltage has a lower level than the second internal power supply voltage.

2. The semiconductor memory device according to claim 1, wherein at a burn-in test mode of operation, the control circuit controls the internal voltage generator circuit so that the second internal power supply voltage has a lower level than the first internal power supply voltage.

3. A semiconductor memory device comprising:
an array of memory cells which are arranged in a matrix of rows and columns;
a data read/write circuit which writes/reads out data to/from the array;
an internal voltage generator circuit which adjusts an external power supply voltage and generates a first internal power supply voltage and a second internal power supply voltage;
a first power supply line which transfers the first internal power supply voltage to the array;
a second power supply line which transfers the second internal power supply voltage to the data read/write circuit; and
a control circuit which controls the internal voltage generator circuit so that the first and second internal power supply voltage vary according to an operational mode of the semiconductor memory device;
wherein at a normal mode of operation, the control circuit controls the internal voltage generator circuit so that the first internal power supply voltage has the same level as the second internal power supply voltage, the first and second internal power supply voltages being constantly maintained irrespective of variation of the external power supply voltage.

4. A semiconductor memory device comprising:
an array of memory cells which are arranged in a matrix of rows and columns;
a row selector circuit which selects at least one of the rows in response to a row address;
a column selector circuit which selects a part of the columns in response to a column address;
a sense amplifier circuit which senses and amplifies data from memory cells in the selected row and columns;
a write drive circuit which writes data to the memory cells in the selected row and columns;
an internal voltage generator circuit which adjusts an external power supply voltage and generates a first internal power supply voltage and a second internal power supply voltage;
a first power supply line which transfers the first internal power supply voltage to the array;
a second power supply line which transfers the second internal power supply voltage to the row selector circuit, the column selector circuit, the sense amplifier circuit, and the write driver circuit; and
a control circuit which controls the internal voltage generator circuit so that the second internal power supply voltage has a lower level than the first internal power supply voltage at a package/wafer burn-in test mode of operation;
wherein at a test mode of operation for controlling a static noise margin of the memory cells, the control circuit controls the internal voltage generator circuit so that the first internal power supply voltage has a lower level than the second internal power supply voltage.

5. The semiconductor memory device according to claim 4, wherein at the package/wafer burn-in test mode of operation, the first and second internal power supply voltages vary in proportion to variation of the external power supply voltage.

6. The semiconductor memory device according to claim 4, wherein at the test mode of operation for controlling a static noise margin of the memory cells, the second internal power supply voltage varies while the first internal power supply voltage does not vary.

7. The semiconductor memory device according to claim 4, wherein at the test mode of operation for controlling a static noise margin of the memory cells, the first internal power supply voltage varies while the second internal power supply voltage does not vary.

8. The semiconductor memory device according to claim 4, wherein at the test mode of operation for controlling a static noise margin of the memory cells, the first and second internal power supply voltages vary contrary to each other.

9. A semiconductor memory device comprising:
an array of memory cells which are arranged in a matrix of rows and columns;
a row selector circuit which selects at least one of the rows in response to a row address;
a column selector circuit which selects a part of the columns in response to a column address;
a sense amplifier circuit which senses and amplifies data from memory cells in the selected row and columns;
a write driver circuit which writes data to the memory cells in the selected row and columns;
an internal voltage generator circuit which adjusts an external power supply voltage and generates a first internal power supply voltage and a second internal power supply voltage;
a first power supply line which transfers the first internal power supply voltage to the array;
a second power supply line which transfers the second internal power supply voltage to the row selector circuit, the column selector circuit, the sense amplifier circuit, and the write driver circuit; and
a control circuit which controls the internal voltage generator circuit so that the second internal power supply voltage has a lower level than the first internal power supply voltage at a package/wafer burn-in test mode of operation;
wherein at a normal mode of operation, the control circuit controls the internal voltage generator circuit so that the first internal power supply voltage has the same level as the second internal power supply voltage, the first and second internal power supply voltages being constantly maintained irrespective of variation of the external power supply voltage.

10. A semiconductor memory device comprising:
an array of memory cells which are arranged in a matrix of rows and columns;
a data read/write circuit which writes/reads out data to/from the array;
a reference voltage generator circuit which generates a reference voltage of a constant level;
a first variable reference voltage generator circuit which is supplied with the reference voltage and an external power supply voltage and generates a first variable reference voltage in response to a first control code;
a second variable reference voltage generator circuit which is supplied with the reference voltage and the external power supply voltage and generates a second variable reference voltage in response to a second control code;
a first internal voltage generator circuit which is supplied with the external power supply voltage and generates a first internal power supply voltage in response to the first variable reference voltage;
a first power supply line which transfers the first internal power supply voltage to the array;
a second internal voltage generator circuit which is supplied with the external power supply voltage and generates a second internal power supply voltage in response to the second variable reference voltage;
a second power supply line which transfers the second-internal power supply voltage to the data read/write circuit; and
a control circuit which generates the first control code and the second control code in response to a test information,
wherein at a package/wafer burn-in test mode of operation, the control circuit generates the first and second control codes so that the first internal power supply voltage is established higher than the second internal power supply voltage.

11. The semiconductor memory device according to claim 10, wherein at the test mode of operation, the first and second internal power supply voltages vary in proportion to variation of the external power supply voltage.

12. The semiconductor memory device according to claim 10, wherein at a test mode of operation for controlling a static noise margin of the memory cells, the control circuit generates the first and second control codes so that the second internal power supply voltage is established higher than the first internal power supply voltage, the first and second internal power supply voltages being constantly maintained irrespective of variation of the external power supply voltage.

13. The semiconductor memory device according to claim 12, wherein at the test mode of operation for controlling a static noise margin of the memory cells, the second internal power supply voltage varies while the first internal power supply voltage does not vary.

14. The semiconductor memory device according to claim 12, wherein at the test mode of operation for controlling a static noise margin of the memory cells, the first internal power supply voltage varies while the second internal power supply voltage does not vary.

15. The semiconductor memory device according to claim 12, wherein the test mode of operation for controlling a static noise margin of the memory cells, the first and second internal power supply voltages vary contrary to each other.

16. The semiconductor memory device according to claim 10, wherein at a normal mode of operation, the control circuit generates the first and second control codes so that the first internal power supply voltage has the same level as the second internal power supply voltage.

17. The semiconductor memory device according to claim 16, wherein the test information is inputted to the control circuit by JTAG code, command combination, or a pin which is not used at a normal mode of operation.

18. A semiconductor memory device comprising:
a first generator for supplying a first internal power supply voltage to a memory cell array;
a second voltage generator for supplying a second internal power supply voltage to one or more peripheral circuits; and
a control circuit for controlling the first and second voltage generators so that the first and second internal power supply voltages vary according to an operational mode of the semiconductor memory device;
wherein the control circuit controls the first and second voltage generators so that the second internal power supply voltage is greater than the first internal power supply voltage when the semiconductor memory device is in a potential defect property detect mode.

19. The semiconductor memory device of claim 18, wherein the control circuit controls the first and second voltage generators so that the first and second internal power supply voltages are substantially different in a test mode.

20. The semiconductor memory device of claim 18, wherein the control circuit controls the first and second voltage generators so that the first internal power supply voltage is greater than the second internal power supply voltage when the semiconductor memory devices is in a burn-in test mode.

* * * * *